United States Patent [19]

Forsen

[11] 4,058,667
[45] Nov. 15, 1977

[54] ION PROTECTED LINEAR ELECTRON BEAM METAL EVAPORATOR

[75] Inventor: Harold K. Forsen, Bellevue, Wash.

[73] Assignee: Jersey Nuclear-Avco Isotopes, Inc., Bellevue, Wash.

[21] Appl. No.: 630,706

[22] Filed: Nov. 10, 1975

[51] Int. Cl.² .......................................... H01J 37/305
[52] U.S. Cl. ....................................................... 13/31
[58] Field of Search ..................... 13/31; 219/121 EB; 250/284, 288, 298

[56] References Cited

U.S. PATENT DOCUMENTS

| | | | |
|---|---|---|---|
| 2,947,867 | 8/1960 | Brackney | 250/284 |
| 3,307,936 | 3/1967 | Smith, Jr. | 13/31 X |
| 3,437,734 | 4/1969 | Roman et al. | 13/31 |
| 3,655,903 | 4/1972 | Roman et al. | 13/31 |

Primary Examiner—R. N. Envall, Jr.
Attorney, Agent, or Firm—Weingarten, Maxham & Schurgin

[57] ABSTRACT

A linear electron beam evaporation source for a high vapor temperature material such as uranium which is protected against filament degradation from reverse accelerated ions in the generated vapor. Electron beam evaporation is produced by the energy in a focused, cylindrical electron beam emanating from an elongate filament and impinging upon a trough shaped crucible of the material to be evaporated. A set of linear electrodes are provided adjacent to the trajectory of the focused electron beam from the filament to provide a slight deceleration voltage in the electron accelerating potential between the filament and the crucible. The decelerating voltage acts as a potential barrier to the few ions in the generated vapor.

14 Claims, 2 Drawing Figures

ION PROTECTED LINEAR ELECTRON BEAM METAL EVAPORATOR

FIELD OF THE INVENTION

This invention relates to electron beam evaporation techniques and in particular to a linear electron beam evaporator having filament protection.

BACKGROUND OF THE INVENTION

Electron beam evaporation sources have been used as a convenient means in recent years for evaporating high vapor temperature materials such as uranium and other refractive metal elements. Such a technique has been found to be useful for the evaporation of uranium in high quantities for production level isotope separation as is discussed in U.S. Pat. No. 3,772,519 and U.S. Pat. application Ser. No. 328,954, filed Feb. 2, 1973. As used in such apparatus, it is preferable to employ a linear electron beam evaporation source as disclosed in the above-referenced application to provide a long line source of uranium vapor for subsequent isotopically selective ionization and separation. Such a vapor source is also preferably operated at a high vaporization rate for increased enrichment efficiency.

The vapor generated by such a technique, particularly in the high densities employed for isotope separation, has produced therein vapor particles in the ionized state but with a generally low thermal energy. For efficient isotope separation, the vapor source is generally free of obstructions directly above and to both sides of the line source of vapor to permit full utilization of the vapor generated. Accordingly, some of the ions produced in the vapor will easily find their way into all portions of the vaporization chamber including the region of high accelerating voltage for the electron beam used to create vaporization. Once the wandering ions have reached this potential region, they are strongly accelerated by the several tens of Kilovolts of accelerating potential toward the filament or cathode where they impact producing a rapid filament degradation from sputter ejecting of filament particles. Additionally, the heat build-up in the filament due to the ion current striking it will further accelerate filament wear.

BRIEF SUMMARY OF THE INVENTION

In a preferred embodiment for the present invention, a linear electron beam vapor source is shown having a particular electrode structure for providing a slight potential reversal in the electron beam acceleration potential to act as a barrier against the acceleration of ions toward the filament.

In particular implementation, a trough shaped crucible is provided with a reservoir or supply of uranium metal to be vaporized into a radially expanding vapor flow occupying a wide angle above the crucible. An elongate filament, placed to one side of the crucible and extending parallel thereto along the long dimension of the crucible, is operated as a source of electrons which are accelerated and focused onto a line along the long dimension of the surface of the uranium metal in the crucible. The electron beam is accelerated by a potential between the filament and a nearby linear electrode. To prevent the reverse flow of ionized particles in the vapor which migrate into the region of the accelerating potential between the accelerating electrode and the filament, a further electrode is placed adjacent to the accelerating electrode and just above it in the direction of the electron beam trajectory and is biased to produce a reversal of field between it and the accelerating electrode. By properly placing these two electrodes close to the trajectory of the electron beam, a field reversal will be provided as a shield against the reverse flow of ions into the accelerating potential between the accelerating electrode and the filament or cathode. The field reversal thus acts as a barrier or potential hill against the ion flow into the accelerating field. With a potential hill of an appropriate voltage, it should be possible to block the filament from all ions. With fewer or no ionized particles thus accelerated toward the filament, the filament life is extended by reducing or eliminating the filament degradation that occurs from ion sputtering and ion current heating.

BRIEF DESCRIPTION OF THE DRAWING

These and other features of the present invention are more fully described below in the detailed description of the preferred embodiment, and in the accompanying drawing of which.

DETAILED DESCRIPTION OF THE PREFERRED EMBODIMENT

The present invention contemplates apparatus for shielding the linear filament of a linear electron beam vaporization source from reverse ion flow that would otherwise strike the filament and reduce filament life. The ion protection is achieved by a combination of accelerating and decelerating electrodes in conjunction with a driving potential distribution through the electrode structure which creates a small field reversal in the region directly beyond the accelerating electrode in a direction which repels ions that would migrate toward the accelerating potential and be driven into the filament.

Figure 1:
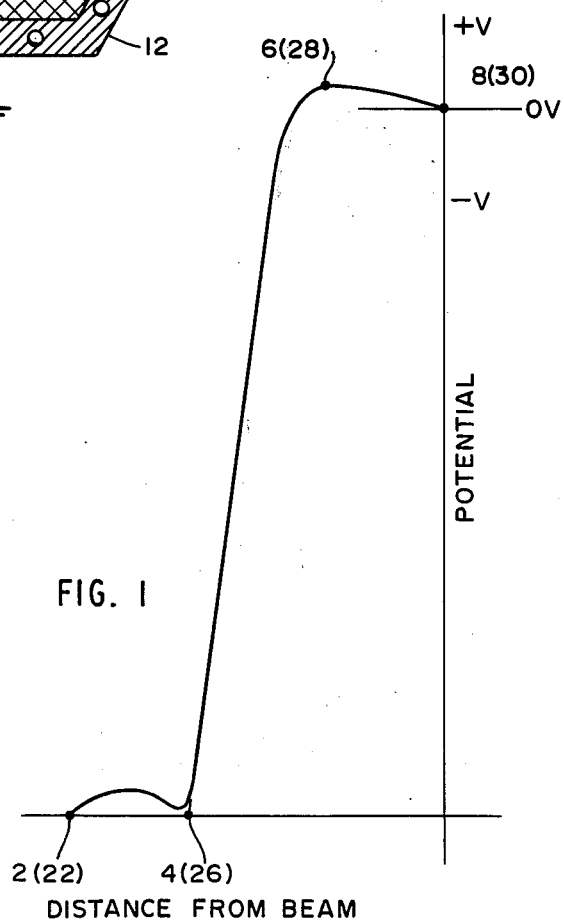
FIG. 1 is a potential diagram useful in explaining the operation of the invention.

The principle of the invention is illustrated in FIG. 1 showing diagrammatically a potential distribution diagram. FIG. 1 indicates the potential which is established between a filament 2, or cathode, and an electrode 8 typically at the potential of the crucible containing the uranium or material to be evaporated. As illustrated, the electron beam is directed from filament 2 past an optional beam former electrode 4, which is at the potential of the filament, by the attraction of a high, relative positive potential of many Kilovolts between the filament 2 and electrode 6 at an accelerating electrode 6. Beyond the accelerating electrode 6, the electrode 8 is placed and energized with a small negative potential, typically a hundred volts, relative to the accelerating electrode 6 to provide a deceleration potential.

When viewed in the context of FIG. 1, the deceleration of the electron beam between the electrodes 6 and 8 is a small percentage of the total accelerating potential. By increasing that accelerating potential by an amount corresponding to the decelerating potential, the effect of the latter on the electron beam can be offset. The deceleration electrode nevertheless provides a potential barrier to the passage of background ions beyond the accelerating electrode 6 to the region between electrodes 2 or 4 and 6 where they would otherwise diffuse and be accelerated into the filament 2 with destructive results.

Figure 2:
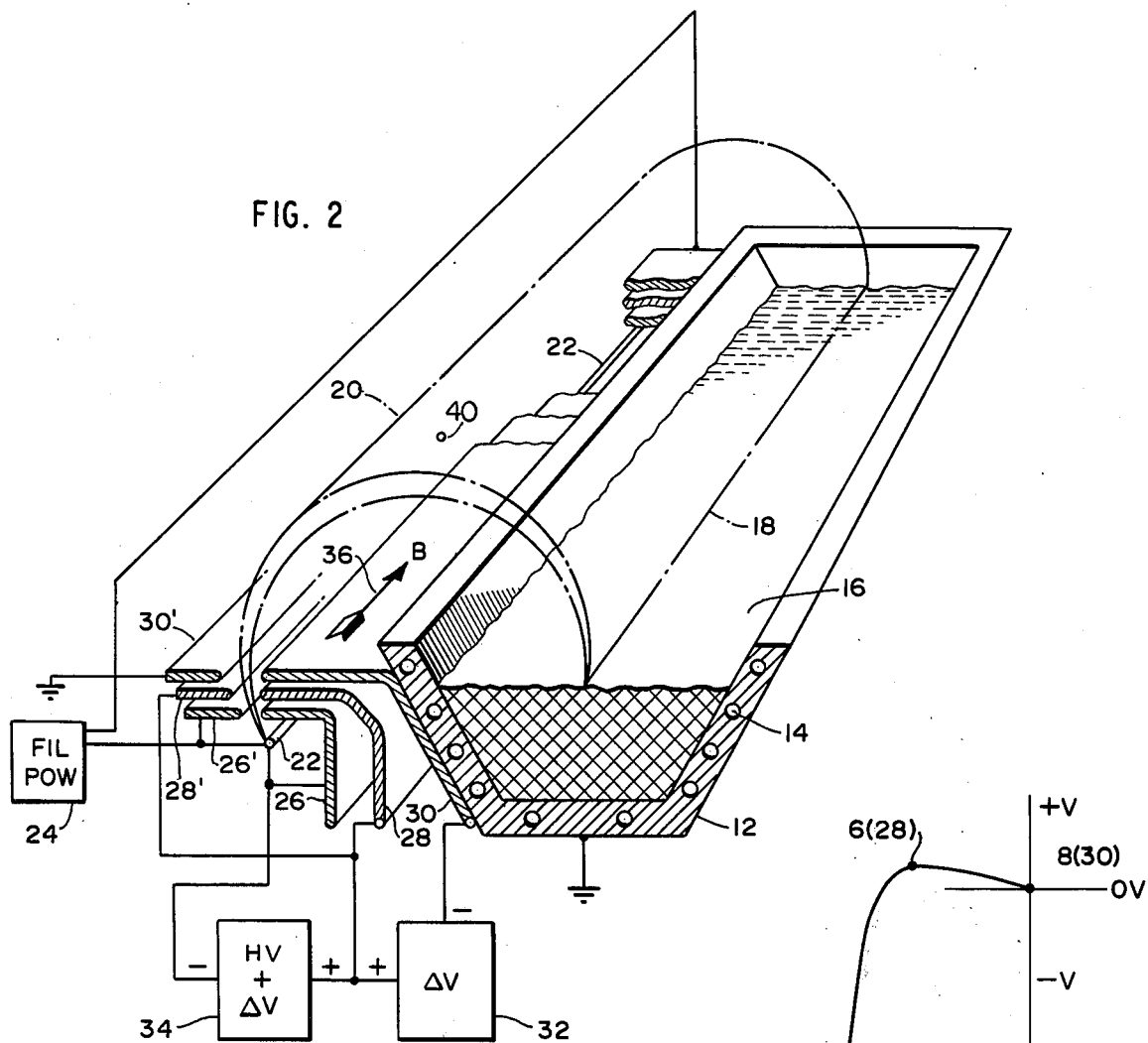
FIG. 2 is a sectioned pictorial view of a linear electron beam vapor source having ion protection according to the present invention.

An exemplary preferred embodiment for accomplishing the operation of the present invention illustrated in FIG. 1 is shown in FIG. 2, a sectioned pictorial view of a linear electron beam evaporation source employing the ion protection apparatus of the present invention. The dimensions and arrangement of elements shown in FIG. 2 are to be viewed as exemplary only, substantial latitude being intended in the shown structure for accomplishing the invention. As shown there a crucible 12, typically fabricated of copper, and having a plurality of cooling ports 14 for the circulation of water or other cooling material, contains a supply of uranium 16 which is to be evaporated from a line 18 along the surface of the uranium. The heating at the line 18 is accomplished by energy in an electron beam 20 which has, as shown, a generally cusp shaped arcuate cross-section and extends generally the entire long dimension of the crucible 12.

The electron beam 20 is generated from a filament 22 which is an elongated wire typically of tungsten and of one or more millimeters in diameter and approximately one meter in length. The filament 22 is supported at its ends by insulator brackets not shown. The filament 22 is energized by a filament power source 24 which supplies typically one kilowatt of heating current to the filament to raise its thermal energy to the point of substantial electron emission.

A set of electrodes according to the present invention are provided to shape and accelerate the electrons emitted from the filament 22 into the beam 20 and to provide a potential barrier against the migration of ions into the region of the electron acceleration. The first of these electrodes is a beam former comprising electrodes 26, 26' which are preferred but optional. They are placed directly above the filament 22. Electrode 26 has a generally L shaped cross-section and a tip which confronts the beam 20 from the crucible side. Electrode 26' has a tip portion which confronts the beam 20 on the other side to provide a slit between the electrodes 26 and 26' for the beam 20. Electrodes 26 and 26' extend the length of the filament 22 and are at the same potential as the filament. Accelerating electrodes 28 and 28' are placed just above the beam forming electrodes 26 and 26' respectively. Electrode 28 is shown also to have a generally L shaped cross-section. Electrodes 28 and 28' extend lengthwise the distance of the filament 22. Decelerating electrodes 30 and 30' have tip portions just above the electrodes 28 and 28' respectively and similarly extend the length of the filament 22. Electrodes 26, 26', 28, 28' and 30, 30' are typically of copper material. Electrodes 28 (28') and 30 (30') are positioned approximately 0.1 and 0.3 cm from electrode 26 (26') respectively. The spacing between the electrodes 26 and 28 which are used for electron acceleration are defined by the current desired in the electron beam in accordance with the energy to be applied to evaporate the uranium 16. This spacing is governed by the Child-Langmuir space-charge law as, for example, discussed in Spangenberg; VACUUM TUBES: McGraw-Hill; 1948, pp 168–173. The separation between electrodes 26 and 26', between electrodes 28 and 28' and electrodes 30 and 30' is determined by the considerations of electron beam current and electric field shape and is about the same as the vertical spacing.

The decelerating electrodes 30 and 30' are kept at the ground potential of the crucible 12. Typically, electrode 30 contacts the crucible for this purpose although other configurations are possible. The accelerating electrodes 28 and 28' are kept at a slightly positive voltage with respect to the crucible 12 by a low voltage power supply 32 of typically 100 volts. The accelerating field between the accelerating electrodes 28 and 28' and the filament 22 is supplied by a high voltage power supply 34 of typically 30 Kv which has a total voltage equal to the desired accelerating voltage plus the voltage of the low voltage supply 32. The low voltage supply 32 is connected with its negative terminal to the ground potential of the electrodes 30 and 30' and the crucible 12 and its positive terminal to the electrodes 28 and 28'. The high voltage power supply 34 has its positive terminal connected to the accelerating electrodes 28 and 28' and its negative terminal connected to the filament 22. As described above, the effect of the low voltage supply 32 is to provide a decelerating potential between the electrodes 28, 28' and 30, 30' which impedes the migration of ions in the region above the electrodes 30 and 30' into the region of the principal accelerating field produced between the accelerating electrodes 28, 28' and the filament 22.

The presence of ions 40 in the vapor source of FIG. 2 can be attributed to at least two sources. The first is the background ionization which is inherent in the thermal vaporization of the uranium material and is governed by the well known Saha equation. The other source of ions in the expanding uranium vapor from the line 18 of vaporization is collisional ionization of neutral uranium particles in the expanding vapor by the electron beam 20.

These ions produced or existing in the region above the crucible 12 and electrodes 30 and 30' will generally have a low thermal velocity in the direction of the filament 22 due to the high expansion velocity of the uranium vapor. Nevertheless, scattering and diffusion effects will lead to the appearance of a small number of ions in the region above electrodes 30 and 30' which, if they should reach the accelerating voltages between the filament 22 and the electrodes 28 and 28', would be attracted to the filament 22.

Since as described in the above-referenced U.S. patent application Ser. No. 328,954 it is desired to direct substantially all of the generated vapor into illumination and separation chambers for efficient uranium enrichment, and since the region between the crucible 12 and the filament 22 is occupied by the high energy electron beam 20, it is generally impractical to place a physical barrier between the crucible 12 and the filament 22 to prevent the ions from reaching these accelerating voltages. Moreover, since the electron beam 20 is guided and focused by a magnetic field 36 running generally parallel to the crucible 12 and filament 22, there will also be a natural tendency for ions to curve about the lines of induction of field 36 into the filament 22 augmenting the number of ions appearing in this region. Field 36 is generated by a set of typically 5 surrounding magnetic field windings, not shown.

The electrode structure of the present invention impedes the flow of these ions 40 to filament 22 without obstructing the flow of vapor. For this purpose, the power supply 32 maintains a low voltage between the electrodes 28, 28' and 30, 30' producing a reverse field in the trajectory of the electron beam 20 which accomplishes a slight deceleration of the electrons 38 in beam 20. But by having increased the voltage in the supply 34 by a similar amount, the deceleration leaves the electrons with the exact desired energy for impact at the line 18. The deceleration field between the electrodes 28, 28' and the electrodes 30, 30' does, however, produce a potential hump or barrier to ions 40 which may diffuse or scatter into the region above the filament and electrode structure, thereby impeding the flow of ions into the region where they may be accelerated by the field accelerator to crash into the filament 22 with the resulting increase in filament wear.

The above-described preferred embodiment for the present invention is illustrative of one form for the invention only, alterations and modifications being deemed to be within its scope and spirit. The breadth of the invention is intended to be limited only as defined in the following claims.

What is claimed is:

1. An ion protected linear electron beam evaporation system comprising:
    a generally trough shaped, elongated crucible containing a supply of a material to be evaporated;
    an elongate source of electrons extending in a direction parallel to the long dimension of said crucible;
    means for applying an electron accelerating potential over a portion of an arcuate trajectory for the electron beam from said source to said crucible;
    means for focusing electrons from said source of electrons on said trajectory onto the surface of the material to be evaporated in said crucible generally in a line along the long dimension of said crucible;
    the focused electron beam from said source evaporating the material within said crucible to provide a vapor of said material including a plurality of ions;
    means for providing a decelerating electrostatic field over a portion of the trajectory of said focused electron beam beyond said accelerating potential before said crucible and in a potential sufficient to generally impede the motion of the ions in the vapor from penetrating the region of said accelerating potential and striking said source.

2. The evaporation system of claim 1 wherein said decelerating means includes:
    first and second electrodes having linear tip portions extending along the length of the focused electron beam and with the first electrode displaced along the direction of said electron beam from said second electrode;
    means for applying an electric field between said first and second electrodes in a direction which is positive at said second electrode; and
    means for maintaining the potential of said source negative with respect to said first and second electrodes.

3. The evaporation system of claim 2 wherein said tip portion of said first and second electrodes define respective slits positioned to sequentially accelerate and decelerate the electron beam from said source on said trajectory.

4. The evaporation system of claim 2 wherein said first and second electrodes are approximately 0.2 centimeters apart.

5. The evaporation system of claim 2 wherein said second electrode is maintained approximately 30 Kv positive with respect to said source by said accelerating potential means and said first electrode is maintained approximately 100 volts negative with respect to said second electrode by said decelerating field means.

6. The evaporation system of claim 2 wherein said first electrode is electrically in contact with said crucible.

7. The evaporation system of claim 2 including:
    a high voltage source and a low voltage source connected in series therebetween with the positive potentials of said high voltage and low voltage sources joined;
    said second electrode being connected to the junction between said high voltage and low voltage sources;
    said first electrode being connected to said low voltage source at the negative potential thereof; and
    said source being connected to said high voltage source at the negative potential thereof.

8. The evaporation system of claim 2 wherein said first and second electrodes are fabricated of a highly conducting material.

9. The evaporation system of claim 2 wherein said source is a filament.

10. The evaporation system of claim 9 wherein said filament is tungsten.

11. The evaporation system of claim 1 wherein said material to be vaporized includes uranium.

12. The evaporation system of claim 1 wherein said focusing means includes:
    a magnetic field; and
    a beam forming electrode intermediate said source and said accelerating means.

13. The evaporation system of claim 12 wherein said beam forming electrode includes first and second members defining a slit for the electron beam from said source.

14. An ion protected linear electron beam uranium evaporation system comprising:
    an elongate, water cooled crucible containing a reservoir of uranium metal;
    a filament placed to one side of said crucible and extending generally parallel to the long dimension thereof;
    a beam forming electrode extending generally parallel to said filament, having a generally L shaped cross-section member placed generally between said filament and said crucible and a further member to define a first slit above said filament;
    an accelerating electrode having a member between said beam forming electrode and said crucible and in generally nesting relationship with said beam forming electrode and a further member to define a second slit above said first slit;
    a source of high voltage connected with the positive terminal to said accelerating electrode and the negative terminal to said filament;
    a decelerating electrode electrically connected to said crucible and having members extending out above said accelerating electrode to define a third slit above said second slit;
    a low voltage source having the positive terminal thereof connected to said accelerating electrode and the negative terminal thereof connected to said decelerating electrode and said crucible;
    means for heating said filament to the point of electron emission;
    means for focusing the electrons emitted from said filament in an arcuate trajectory passing through said first, second and third slits to a generally line pattern on the surface of uranium in said crucible.

* * * * *